Nov. 17, 1970 G. R. BASHAM 3,541,354

DIGITAL-TO-ANALOG CONVERTER

Filed March 6, 1967

GARY R. BASHAM
INVENTOR.

BY

Ernest L. Brown
ATTORNEY

United States Patent Office 3,541,354

Patented Nov. 17, 1970

3,541,354

DIGITAL-TO-ANALOG CONVERTER

Gary R. Basham, Los Angeles, Calif., assignor to Litton Systems, Inc., Beverly Hills, Calif., a corporation of Maryland

Filed Mar. 6, 1967, Ser. No. 620,863
Int. Cl. H03k *17/00*
U.S. Cl. 307—251 14 Claims

ABSTRACT OF THE DISCLOSURE

A digital-to-analog converter using an operational amplifier and a weighted current-voltage ladder, and further comprising a particular, very accurate, controllable current-voltage source in at least a portion of said ladder network.

SHORT DESCRIPTION OF THE INVENTION

This invention pertains to a network for converting digital signals into analog signals, and more particularly to such a device which uses a new and modern precise controllable current and voltage source.

In modern circuit technology it is frequently desired to fabricate the circuit in miniature form on a silicon chip, or the like. When fabricating circuits on a chip, it is important to make the individual components small while maintaining their accuracy. In fabricating resistors on a chip, the resistors having higher resistance values are very small and maintaining their accuracy is difficult. Typically semi-conductors having a low forward resistance tend to be relatively large; reducing their size to accommodate more semi-conductors on a chip increases their forward resistance. To provide a digital-to-analog converter which uses resistors and semi-conductors of optimum density of component packing while maintaining high accuracy of conversion, the scheme of this invention was conceived. To that end, the conceived circuits use resistors of relatively low resistance values and semi-conductor devices having negligible bias in circuit positions where their high forward resistances are insignificant.

The accuracy of a digital-to-analog converter with a weighted current driving network and operational amplifier depends upon the accuracy of the scaling resistors. If more than a few bits are converted by a weighted current network, the absolute values of the scaling resistances become very high which causes them to be difficult to fabricate on a silicon chip, printed circuit, and the like. Further, as the resistance becomes higher the noise increases while the signal decreases, i.e. the signal to noise ratio is decreased.

The device of this invention uses a weighted voltage-current network with an operational amplifier to convert a digital signal into an analog signal. A weighted current driving network with extremely accurate current-voltage sources is used to receive the higher order bits of the digital signal; a weighted voltage ladder network is used to receive the lower order bits of the digital signal. Thus, the extreme accuracy of the current driving network with highly accurate current-voltage sources and low resistance scaling resistors is used in converting the higher order bits where that extreme accuracy is needed. The lowest order of bit received by such weighted current driving network is limited by the resistance size and required accuracy of the scaling resistor.

A weighted voltage driving network is also connected to the input of the operational amplifier and is adapted to receive signals corresponding to the lower order bits of the digital signal. The voltage driving network uses resistors whose resistances do not increase as the order of the bit decreases. The driving sources of the voltage ladder network, because only the lower order bits are scaled by that network, need not be extremely accurate to produce driving signals of the appropriate amplitude and precision.

The extremely accurate current-voltage source of this invention which is used to drive each of the inputs to the current ladder is adapted to be switched by a device such as a metal-oxide-silicon field-effect-transistor (called with a reference voltage source, which has a voltage amplitude equal to the amplitude desired to be plitude equal to the ampltiude desired desired to be switched across the scaling resistor, across the output terminals. A second MOS FET is connected in series with a voltage source and current-limiting resistor, in parallel with the first MOS FET and reference voltage source, across the output terminals. The control electrodes of the two MOS FET devices are connected to be closed in synchronism. The amplitude of the voltage of the second voltage source and the resistance of the current-limiting resistor are such that the current flow through the reference voltage source is negligible; the voltage drop across the first MOS FET is also negligible A third MOS FET is connected across the scaling resistor and is adapted, when conducting, to produce a zero voltage across the scaling resistor. In a preferred embodiment a fourth MOS FET, closed in synchronism with the third MOS FET, and is connected, when closed, to form a closed current path for the second voltage source and current-limiting resistor; it is connected to remove the voltage from the second MOS FET.

It is therefore an object of this invention accurately to convert digital signals into analog signals.

It is another object of this invention to generate highly accurate voltages and currents.

It is a more particular object of this invention to generate highly accurate voltages and currents in response to digital signals.

It is a more specific object of this invention to provide apparatus for achieving the above enumerated objects.

Other objects will become apparent from the following description, taken in connection with the accompanying drawings, in which.

DETAILED DESCRIPTION OF THE INVENTION

Figure 1:
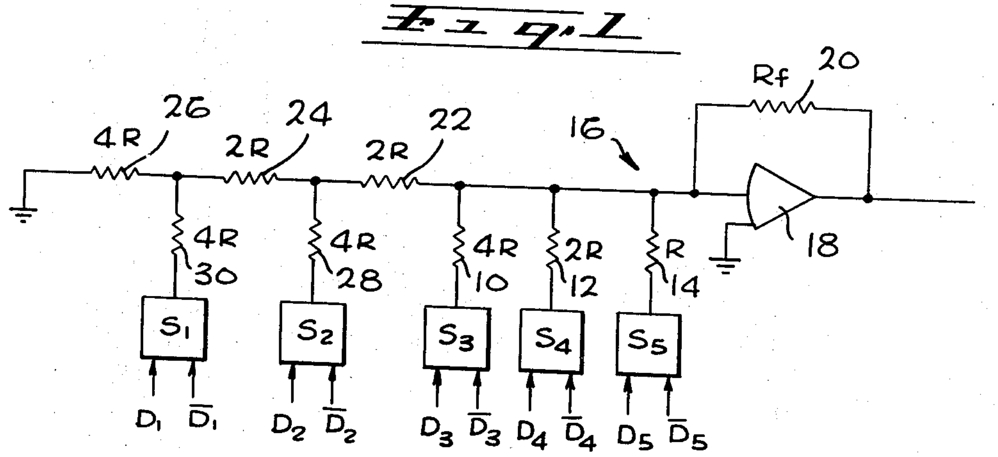
FIG. 1 is a partly schematic and partly block diagram of a digital-to-analog converter in accordance with this invention.

A typical digital-to-analog conversion circuit is shown in FIG. 1. The circuit of FIG. 1 is adapted to convert a five bit number into a corresponding scaled analog voltage. In the circuit of FIG. 1, the voltage-current sources $S_3$, $S_4$, and $S_5$ correspond to the three highest order bits $D_3$, $D_4$, and $D_5$ of a five bit binary number. It is understood that the $D_5$ bit may be a sign bit. The voltage-current sources $S_3$, $S_4$, and $S_5$ are connected to apply a current of predetermined accurate amplitude to the scaling resistors 10, 12 and 14 of a current ladder which is connected to a summing junction 16; the summing junction 16 is servoed to the ground potential by the operational amplifier 18 and the feedback resistor 20. It is to be noted that in the current bridge circuit the resistance of resistor 12 is one-half of the resistance of resistor 10, and that the resistance of resistor 14 is one-half of the resistance of resistor 12. Consequently, when voltage-current source $S_5$ is energized by the reception of a signal $D_5$ a particular quantum of current is delivered from source $S_5$, through resistor 14, to the junction 16. When the voltage-current source $S_4$ is energized by the reception of a signal $B_4$, a quantum of current, which is one-half the amount of current delivered by source $S_5$, is delivered through resistor 12 to the junction 16. Similarly, the voltage-current source $S_3$ is adapted, when energized, to deliver one-half the amount of current to junction 16 that may be delivered from current source $S_4$.

The lower order of bit signals, represented by $D_1$ and $D_2$, are connected to control the voltage-current sources $S_1$ and $S_2$ which, in turn, are connected into a voltage ladder comprising a series connection of resistors 22, 24 and 26 which are connected at one end to junction 16 and at the other end to the ground terminal. The voltage-current source $S_2$ is connected through resistor 28 to the junction between resistors 22 and 24. The voltage-current source $S_1$ is connected through resistor 30 to the junction between resistor 24 and 26. The amplitude of the resistances of resistors 28 and 30, and of the terminating resistor 26 are equal in amplitude to the resistance of the scaling resistor corresponding to the lowest order bit in the current ladder, e.g. resistor 10. The resistances of resistors 22 and 24 are equal to one-half of the resistance of resistors 28 and 30.

In operation of the circuit of FIG. 1, the presence of a signal $D_1$ causes one unit of current to be delivered from source $S_1$ through resistors 30, 24 and 22 to the summing junction 16. The presence of a signal $D_2$ causes two units of current to be delivered from voltage-current source $S_2$ through resistors 28 and 22 to the summing junction 16. The presence of a signal $D_3$ causes four units of current to be delivered from voltage-current source $S_3$ through resistor 10 to the junction 16. The presence of a signal $D_4$ causes eight units of current to be delivered by voltage-current source $S_4$ through resistor 12 to junction 16. The presence of a signal $D_5$ causes sixteen units to be delivered by voltage-current source $S_5$ through resistor 14 to the junction 16. The magnitude of current delivered to junction 16 is matched by a corresponding voltage amplitude of opposite sign at the output terminal of operational amplifier 18.

Figures 2, 3, 4:
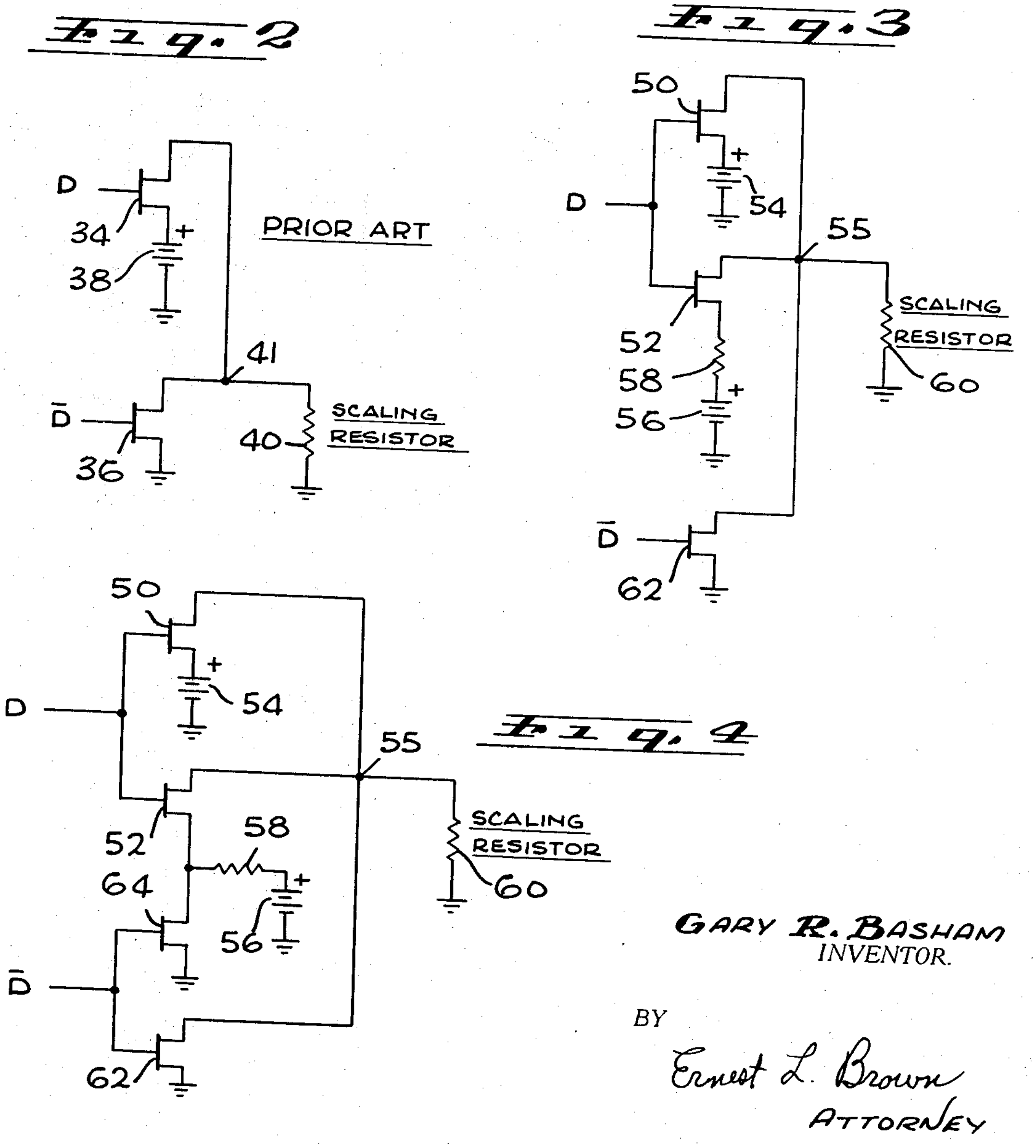
FIG. 2 is a controllable voltage-current source, in accordance with the prior art.
FIG. 3 is an improved voltage-current source of this invention.
FIG. 4 is a preferred embodiment of the voltage-current source of this invention.

The circuit of FIG. 2 shows a prior art voltage-current source which uses a pair of MOS FET devices 34 and 36 to connect either the voltage of voltage source 38 or a zero voltage across the scaling resistor 40. Circuits such as that shown in FIG. 2 are adapted to be used as the voltage-current sources in the voltage ladder corresponding to the lowest order binary bit positions of FIG. 1, e.g., $S_1$ and $S_2$.

In operation of the device of FIG. 2, when a signal appears at D, of MOS FET 34, the positive terminal of voltage source 38 is connected to junction 41, thereby causing a current to flow from voltage source 38 through MOS FET 34 and through the scaling resistor 40. Unfortunately, because significant current flows through MOS FET 34, the voltage drop across device 34 is significant and the voltage across resistor 40 is substantially less than the voltage of voltage source 38. In fact, because of the mass production of MOS FET devices the voltage drop across device 34 cannot accurately be predicted; consequently the current amplitude through scaling resistor 40 contains a significant error. The significant errors in the voltage across scaling resistor 40 and the current through scaling resistor 40 do not cause difficulty when the device of FIG. 2 is used for the voltage-current source in the voltage ladder corresponding to the lowest order bits to be converted.

A first embodiment of the voltage-current source of this invention is shown in FIG. 3. In FIG. 3, the MOS FET devices 50 and 52 are connected to be closed and opened together. The reference voltage source 54 is connected through MOS FET device 50 to terminal 55. The voltage source 56 is connected through current-limiting resistor 58 and MOS FET 52 to terminal 55. The voltage of voltage source 56 and the resistance of resistor 58 are chosen such that almost all of the required current in scaling resistor 60 comes from source 56. Only a small trickle of current is delivered by source 54, whereby the voltage drop across MOS FET 50 is insignificant and the voltage across scaling resistor 60 is accurately held at the value of the voltage of reference source 54. With the voltage across resistor 60 held at a precise value, the current delivered through scaling resistor 60 is also held to a precise value. The MOS FET 62 is connected to be closed and opened in phase opposition to the control of devices 50 and 52 to cause zero voltage to appear, when device 62 conducts, across scaling resistor 60.

Unfortunately, in the device of FIG. 3, when MOS FET 62 is conducting and devices 50 and 52 are not conducting, all of the voltage of voltage source 56 appears across device 52 which may cause device 52 to break down. To prevent device 52 from breaking down, the MOS FET device 64 of FIG. 4 has been added. FIG. 4 is a preferred embodiment which is needed when the voltage of voltage source 56 substantially exceeds the allowable voltage across device 52 when device 52 is in its non-conducting condition. The device 64 provides a return path for the current from voltage source 56 and clamps the junction between resistor 58 and device 52 into substantially a ground potential when the junction 55 is clamped into a ground potential.

In each of the devices of FIGS. 2, 3 and 4, it should be noted that when the devices 36 and 62 are actuated, there is no voltage drop across the devices because there is substantially no current flow through them.

Thus the device of this invention accurately transforms a binary digital signal into an analog signal. Further, the transformation may accurately be made because of the highly accurate current sources which are now available in accordance with this invention.

In a typical twelve bit digital-to-analog converter it is feasible to cause the first five highest order bits to form a current ladder with the remaining seven highest order bits connected to a voltage ladder. In the voltage-current sources of the five most significant bits, a practical value of the scaling resistor is 5000 ohms for the highest order, or 12th bit. The scaling resistor for the 11th bit is 10,000 ohms, the scaling resistor for the 10th bit is 20,000 ohms, the scaling resistor for the 9th order bit is 40,000 ohms, and the scaling resistor for the 8th order is 80,000 ohms. Each of the series resistors of the voltage ladder, such as resistors 28 and 30 of FIG. 1, will be 80,000 ohms, the terminating resistor such as resistor 26 would be 80,000 ohms, and the series or line resistors, such as resistors 22 and 24, would be 40,000 ohms.

In the typical twelve bit circuit, with resistor 60, for example, at 5000 ohms, the voltage of the reference voltage source 54 might be four volts, the voltage of voltage source 56 might be twelve volts, and the resistance of resistor 58 might be 9900 ohms, with the conducting or forward resistance of devices 50 and 52 nominally 100 ohms. If the values were precise, no current would be delivered by source 54. Should the voltage between terminal 55 and the ground terminal tend to deviate slightly from four volts (for example because of temperature variation), a small amount of current would be delivered from source 54. Because the current delivered by source 54 would be very small, the voltage drop across MOS FET device 50 would be very small. The voltage at terminal 55, in the presence of a signal D, would stabilize at four volts.

Typical resultant accuracy of the digital-to-analog conversion is on the order of 0.01 percent.

In the operation of the devices of FIGS. 3 and 4, the presence of a signal D corresponds to the lock of a signal $\overline{D}$, and vice versa, i.e. the signals D and $\overline{D}$ are opposite control signals.

When the signal D appears, the voltage at output terminal 55 rises to the voltage of reference source 54. When the signal $\overline{D}$ appears, the voltage at output terminal 55 is lowered to the voltage of the grounded output terminal by the closing of device 62.

In FIG. 4, when a $\overline{D}$ signal appears, the voltage across the open device 52 is reduced to the voltage across the closed device 64.

Although the voltage sources 38, 54 and 56 are shown as D.C. voltage sources, they may be synchronous A.C. voltage sources of variable waveform, e.g. sinusoidal, square wave, and the like. It is essential that the ratio of the voltages of sources 56 and 54 remain substantially constant.

Thus the device of this invention is a highly accurate digital-to-analog converter which uses a new and novel highly accurate controllable voltage-current source in the driving of the current bridge in the higher order bit positions.

Although the device has been described in detail above, it is not intended that the description should limit the invention, but that the invention should be limited by the spirit and scope of the appended claims.

I claim:

1. A controllable voltage-current source comprising:

a pair of output terminals;

a reference voltage source in series with a first switching means, connected between said output terminals, said first switching means being adapted to be controlled by a first input control signal;

a second voltage source in series with a current-limiting resistor and a second switching means, connected between said output terminals, said second switching means being adapted to be controlled in response to said first input signal, the voltage of said second voltage source and the resistance of said current-limiting resistor being adjusted to cause substantially all of the load current delivered to said output terminals to originate from said second voltage source; and a third switching means, connected between said input and said output terminals, adapted to be controlled by a second input signal.

2. A device as recited in claim 1 and further comprising an electrical load connected to at least one of said output terminals, and a return path from said load to said second output terminal.

3. A device as recited in claim 1 and further comprising a fourth switching means adapted to be responsive to said second input signal, connected to switch the current originating at said second voltage source to said second terminal.

4. A device as recited in claim 3 and further comprising an electrical load connected to at least one of said output terminals, and a return path from said load to said second output terminal.

5. A device as recited in claim 1 in which said input signals are opposite.

6. A device as recited in claim 2 in which said input signals are opposite.

7. A device as recited in claim 3 in which said input signals are opposite.

8. A device as recited in claim 4 in which said input signals are opposite.

9. A device as recited in claim 1 in which said switching devices are MOS FET devices.

10. A device as recited in claim 2 in which said switching devices are MOS FET devices.

11. A device as recited in claim 3 in which said switching devices are MOS FET devices.

12. A device as recited in claim 4 in which said switching devices are MOS FET devices.

13. In combination:

an electrical load;

a first voltage source;

a first electrical current path from said first voltage source through said electrical load, including first switching means for controllably opening and closing said first current path in response to a first input signal;

a second voltage source;

a second current path, including a current-limiting resistor, from said second voltage source to said load, and including a second switching means adapted to be opened and closed in response to said first input signal, said current through said second current path being very large compared to the current through said first current path; and third switching means connected to short said first and second current paths, and adapted to be opened and closed in response to a second input signal, said second input signal being opposite to said first input signal.

14. A device as recited in claim 13 and further comprising a third current path from said second voltage source through said current-limiting resistor, and further including a fourth switching means in said third current path which is adapted to be controlled by said second input signal.

References Cited

UNITED STATES PATENTS

| | | | |
|---|---|---|---|
| 2,976,527 | 3/1961 | Smith | 307—255 |
| 3,223,993 | 12/1965 | Dahlberg | 340—347 |
| 3,296,462 | 1/1967 | Reddi | 307—251 |
| 3,401,359 | 9/1968 | Becker | 307—251 |
| 3,449,594 | 6/1969 | Gibson | 307—205 |

DONALD D. FORRER, Primary Examiner

D. M. CARTER, Assistant Examiner

U.S. Cl. X.R.

307—229, 293; 328—143; 340—347